US009720326B2

(12) United States Patent
Recchia et al.

(10) Patent No.: US 9,720,326 B2
(45) Date of Patent: *Aug. 1, 2017

(54) METHOD OF IMPROVING PRINT PERFORMANCE IN FLEXOGRAPHIC PRINTING PLATES

(76) Inventors: David A. Recchia, Smyrna, GA (US); Timothy Gotsick, Acworth, GA (US); Ryan Vest, Cumming, GA (US)

( * ) Notice: Subject to any disclaimer, the term of this patent is extended or adjusted under 35 U.S.C. 154(b) by 1467 days.

This patent is subject to a terminal disclaimer.

(21) Appl. No.: 12/660,451

(22) Filed: Feb. 26, 2010

(65) Prior Publication Data

US 2011/0079158 A1 Apr. 7, 2011

Related U.S. Application Data

(63) Continuation-in-part of application No. 12/571,523, filed on Oct. 1, 2009, now Pat. No. 8,158,331.

(51) Int. Cl.
*G03F 7/09* (2006.01)
*G03F 7/20* (2006.01)
(Continued)

(52) U.S. Cl.
CPC ............ *G03F 7/2012* (2013.01); *G03F 7/09* (2013.01); *G03F 7/201* (2013.01); *G03F 7/202* (2013.01); *B41C 1/055* (2013.01); *B41M 1/04* (2013.01); *B41N 1/12* (2013.01); *Y10T 428/24521* (2015.01)

(58) Field of Classification Search
USPC .......................................... 101/395; 430/306
See application file for complete search history.

(56) References Cited

U.S. PATENT DOCUMENTS 3,249,436 A * 5/1966 Halpern ..................... 430/306
3,265,765 A 8/1966 Holden et al.
(Continued)

FOREIGN PATENT DOCUMENTS

EP 0 456 336 A2 11/1991
EP 0 640 878 A1 3/1995
(Continued)

OTHER PUBLICATIONS

Charlesworth, Karen; "Flexo turns to flat-top dots"; Feb. 21, 2008; PrintWeek; pp. 29-30.*

*Primary Examiner* — Justin Olamit
(74) *Attorney, Agent, or Firm* — Carmody Torrance Sandak & Hennessey LLP

(57) ABSTRACT

A method of making a relief image printing element from a photosensitive printing blank is provided. A photosensitive printing blank with a laser ablatable layer disposed on at least one photocurable layer is ablated with a laser to create an in situ mask. The printing blank is then exposed to at least one source of actinic radiation through the in situ mask to selectively cross link and cure portions of the photocurable layer. Diffusion of air into the at least one photocurable layer is limited during the exposing step and preferably at least one of the type, power and incident angle of illumination of the at least one source of actinic radiation is altered during the exposure step. The resulting relief image comprises a plurality of dots and a dot shape of the plurality of dots that provide optimal print performance on various substrates, including corrugated board.

16 Claims, 10 Drawing Sheets

(51) Int. Cl.
  *B41C 1/055*   (2006.01)
  *B41M 1/04*    (2006.01)
  *B41N 1/12*    (2006.01)

(56) References Cited

U.S. PATENT DOCUMENTS

| | | | |
|---|---|---|---|
| 3,479,185 A | 11/1969 | Chambers, Jr. | |
| 3,867,153 A | 2/1975 | MacLachlan | |
| 4,254,209 A | 3/1981 | Abe et al. | |
| 4,264,705 A | 4/1981 | Allen | |
| 4,320,188 A | 3/1982 | Heinz et al. | |
| 4,323,636 A | 4/1982 | Chen | |
| 4,323,637 A | 4/1982 | Chen et al. | |
| 4,369,246 A | 1/1983 | Chen et al. | |
| 4,414,312 A | 11/1983 | Goff et al. | |
| 4,423,135 A | 12/1983 | Chen et al. | |
| 4,427,759 A | 1/1984 | Gruetzmacher et al. | |
| 4,540,649 A | 9/1985 | Sakurai | |
| 4,622,088 A | 11/1986 | Min | |
| 5,135,827 A | 8/1992 | Bohm et al. | |
| 5,223,375 A | 6/1993 | Berrier et al. | |
| 5,262,275 A | 11/1993 | Fan | |
| 5,330,882 A | 7/1994 | Kawaguchi et al. | |
| 5,506,086 A | 4/1996 | Van Zoeren | |
| 5,776,661 A | 7/1998 | Casaletto et al. | |
| 6,238,837 B1 | 5/2001 | Fan | |
| 6,245,487 B1 | 6/2001 | Randall | |
| 6,355,395 B1 * | 3/2002 | Zwez et al. | 430/271.1 |
| 6,382,099 B1 | 5/2002 | Herrmann | |
| 6,790,598 B2 | 9/2004 | Burke et al. | |
| 7,125,650 B2 | 10/2006 | Roberts et al. | |
| 7,279,254 B2 | 10/2007 | Zwadlo | |
| 7,401,552 B2 | 7/2008 | Daems et al. | |
| 7,419,765 B2 | 9/2008 | Teltschik et al. | |
| 8,142,987 B2 * | 3/2012 | Ali et al. | 430/322 |
| 2003/0129533 A1 * | 7/2003 | Goodin et al. | 430/273.1 |
| 2003/0211423 A1 | 11/2003 | Mengel | |
| 2004/0234886 A1 * | 11/2004 | Rudolph et al. | 430/204 |
| 2008/0076061 A1 | 3/2008 | Figov | |
| 2008/0076066 A1 | 3/2008 | Watanabe | |
| 2008/0305407 A1 * | 12/2008 | Zwadlo et al. | 430/5 |
| 2009/0186308 A1 | 7/2009 | Rudolph | |
| 2009/0191482 A1 | 7/2009 | Rudolph et al. | |
| 2009/0191483 A1 | 7/2009 | Rudolph et al. | |
| 2010/0215865 A1 | 8/2010 | Keoshkerian et al. | |

FOREIGN PATENT DOCUMENTS

| | | | |
|---|---|---|---|
| GB | 1 366 769 | 9/1974 | |
| WO | WO 2009033124 A2 * | 3/2009 | G03F 7/20 |

\* cited by examiner

Sample #13 Digital　　Sample #2 Analog　　Sample #14 Digital

52° with 3.60 mils　　46° with 2.95 mils　　41° with 2.80 mils

Sample #12 Digital

79° with 5.75 mils

AB = dot diameter

EF = radius of a circle with chord AB

CD = segment height of a circle with radius EF transected by chord AB

METHOD OF IMPROVING PRINT PERFORMANCE IN FLEXOGRAPHIC PRINTING PLATES

CROSS-REFERENCE TO RELATED APPLICATIONS

This application is a continuation-in-part of U.S. application Ser. No. 12/571,523, filed on Oct. 1, 2009, the subject matter of which is herein incorporated by reference in its entirety.

FIELD OF THE INVENTION

The present invention relates generally to a method of preparing a relief image flexographic printing element having an improved relief structure thereon, said improved relief structure including a plurality of relief dots that are configured for optimal printing.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

Corrugated board generally includes a corrugating medium which is typically a layer of pleated or multi-grooved paperboard, called "flute", adjacent to a flat paper or paper-like layer called a "liner." A typical corrugated board construction comprises a flute layer sandwiched between two liner layers. Other embodiments may include multiple layers of flute and/or liner. The fluted interlayer provides structural rigidity to the corrugated board. Since corrugated board is used as packaging and formed into boxes and containers, the liner layer forming an exterior surface of the corrugated board is frequently printed with identifying information for the package. The exterior liner layer often has slight indentations due to the uneven support of the underlying flute layer.

A problem that may be encountered when printing on corrugated board substrates is the occurrence of a printing effect referred to as "fluting" (and which is also known as "banding" or "striping" or "washboarding"). Fluting may occur, when printing the liner on the exterior surface of the corrugated board, after the corrugated board has been assembled. The fluting effect is visible as regions of dark printing, i.e., bands of higher density, alternating with regions of light printing, i.e., bands of lighter density that correspond to the underlying fluting structure of the corrugated board. The darker printing occurs where uppermost portions of the pleated innerlayer structure support the printing surface of the liner. The fluting effect can be apparent in areas of a printed image having tones or tint values where the inked areas represent a fraction of the total area as well as in areas of the printed image where the ink coverage is more complete. This fluting effect is typically more pronounced when printing with a flexographic printing element produced using a digital workflow process. Furthermore, increasing the printing pressure does not eliminate striping, and the increased pressure can cause damage to the corrugated board substrate. Therefore, other methods are needed to reduce striping or fluting when printing on corrugated board substrates.

A typical flexographic printing plate as delivered by its manufacturer is a multilayered article made of, in order, a backing, or support layer; one or more unexposed photocurable layers; optionally a protective layer or slip film; and often a protective cover sheet.

The support sheet or backing layer lends support to the plate. The support sheet, or backing layer, can be formed from a transparent or opaque material such as paper, cellulose film, plastic, or metal. Preferred materials include sheets made from synthetic polymeric materials such as polyesters, polystyrene, polyolefins, polyamides, and the like. Generally the most widely used support layer is a flexible film of polyethylene teraphthalate. The support sheet can optionally comprise an adhesive layer for more secure attachment to the photocurable layer(s). Optionally, an antihalation layer may also be provided between the support layer and the one or more photocurable layers. The antihalation layer is used to minimize halation caused by the scattering of UV light within the non-image areas of the photocurable resin layer.

The photocurable layer(s) can include any of the known photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may be used.

The photocurable materials generally cross-link (cure) and harden through radical polymerization in at least some actinic wavelength region. As used herein, actinic radiation is radiation capable of effecting a chemical change in an exposed moiety in the materials of the photocurable layer. Actinic radiation includes, for example, amplified (e.g., laser) and non-amplified light, particularly in the UV and violet wavelength regions. One commonly used source of actinic radiation is a mercury arc lamp, although other sources are generally known to those skilled in the art.

The slip film is a thin layer, which protects the photopolymer from dust and increases its ease of handling. In a conventional ("analog") plate making process, the slip film is transparent to UV light. In this process, the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling. The matte layer typically comprises fine particles (silica or similar) suspended in an aqueous binder solution. The matte layer is coated onto the photopolymer layer and then allowed to air dry. A negative is then placed on the matte layer for subsequent UV-flood exposure of the photocurable layer.

In a "digital" or "direct to plate" plate making process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are ablated by exposing the masking layer to laser radiation at a selected wavelength and power of the laser. Examples of laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or heat plus a blotter. The resulting surface has a relief pattern that reproduces the image to be printed and which typically includes both solid areas and patterned areas comprising a plurality of relief dots. After the relief image is developed, the relief image printing element may be mounted on a press and printing commenced.

The shape of the dots and the depth of the relief, among other factors, affect the quality of the printed image. It is very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas.

Maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (the dot is not "held" on plate and/or on press). Alternatively, if the dot survives processing they are susceptible to damage on press. For example small dots often fold over and/or partially break off during printing causing either excess ink or no ink to be transferred.

Furthermore, photocurable resin compositions typically cure through radical polymerization, upon exposure to actinic radiation. However, the curing reaction can be inhibited by molecular oxygen, which is typically dissolved in the resin compositions, because the oxygen functions as a radical scavenger. It is therefore desirable for the dissolved oxygen to be removed from the resin composition before image-wise exposure so that the photocurable resin composition can be more rapidly and uniformly cured.

The removal of dissolved oxygen can be accomplished, for example, by placing the photosensitive resin plate in an atmosphere of inert gas, such as carbon dioxide gas or nitrogen gas, before exposure in order to displace the dissolved oxygen. A noted drawback to this method is that it is inconvenient and cumbersome and requires a large space for the apparatus.

Another approach that has been used involves subjecting the plates to a preliminary exposure (i.e., "bump exposure") of actinic radiation. During bump exposure, a low intensity "pre-exposure" dose of actinic radiation is used to sensitize the resin before the plate is subjected to the higher intensity main exposure dose of actinic radiation. The bump exposure is applied to the entire plate area and is a short, low dose exposure of the plate that reduces the concentration of oxygen, which inhibits photopolymerization of the plate (or other printing element) and aids in preserving fine features (i.e., highlight dots, fine lines, isolated dots, etc.) on the finished plate. However, the pre-sensitization step can also cause shadow tones to fill in, thereby reducing the tonal range of the halftones in the image.

The bump exposure requires specific conditions that are limited to only quench the dissolved oxygen, such as exposing time, irradiated light intensity and the like. In addition, if the photosensitive resin layer has a thickness of more than 0.1 mm, the weak light of the low intensity bump exposure dose does not sufficiently reach certain portions of the photosensitive resin layer (i.e., the side of the photosensitive layer that is closest to the substrate layer and furthest from the source of actinic radiation), at which the removal of the dissolved oxygen is insufficient. In the subsequent main exposure, these portions will not cure sufficiently due to the remaining oxygen. In an attempt to fix this problem, a selective preliminary exposure, as discussed for example in U.S. Patent Publication No. 2009/0043138 to Roberts et al., the subject matter of which is herein incorporated by reference in its entirety, has been proposed. Other efforts have involved special plate formulations alone or in combination with the bump exposure.

For example, U.S. Pat. No. 5,330,882 to Kawaguchi, the subject matter of which is herein incorporated by reference in its entirety, suggests the use of a separate dye that is added to the resin to absorb actinic radiation at wavelengths at least 100 nm removed from the wavelengths absorbed by the main photoinitiator. This allows separate optimization of the initiator amounts for the bump and main initiators. Unfortunately, these dyes are weak initiators and require protracted bump exposure times. In addition, these dyes sensitize the resin to regular room light, so inconvenient yellow safety light is required in the work environment. Lastly, the approach described by Kawaguchi employs conventional broadband-type sources of actinic radiation light for bump exposure, and thereby also tends to leave significant amounts of oxygen in the lower layers of the resin.

U.S. Pat. No. 4,540,649 to Sakurai, incorporated herein by reference in its entirety, describes a photopolymerizable composition that contains at least one water soluble polymer, a photopolymerization initiator and a condensation reaction product of N-methylol acrylamide, N-methylol methacrylamide, N-alkyloxymethyl acrylamide or N-alkyloxymethyl methacrylamide and a melamine derivative.

According to the inventors, the composition eliminates the need for pre-exposure conditioning and produces a chemically and thermally stable plate.

However all of these methods are still deficient in producing a relief image printing element having a superior dot structure, especially when designed for printing corrugated board substrates.

Thus, there is a need for an improved process for preparing relief image printing elements with an improved relief structure similar to or better than the relief structure of a typical analog workflow process for printing on corrugated board substrates.

There is also a need for an improved relief image printing element that comprises an improved relief structure including printing dots that are configured for superior printing performance on various substrates.

SUMMARY OF THE INVENTION

It is an object of the present invention to provide a relief image printing plate that produces a good result when printing on corrugated board substrates.

It is another object of the present invention to produce a relief image printing plate that reduces print fluting when printing on corrugated board substrates.

It is another object of the present invention to create a relief image printing element that comprises printing dots having a superior dot structure in terms of print surface, edge definition, shoulder angle, depth and dot height.

It is another object of the present invention to provide a dot shape and structure on the printing element that is highly resistant to print fluting.

It is still another object of the present invention to control the surface roughness of the print surface of the relief image printing element.

To that end, the present invention relates generally to a flexographic relief image printing element comprising a plurality of dots in relief, and wherein said plurality of dots comprise at least one characteristic selected from the group consisting of:
  (a) a top surface of the dot is substantially planar;
  (b) a shoulder angle of the dot is such that either (i) the overall shoulder angle of the dot is greater than 50° or (ii) $\theta_1$ is greater than 70° and $\theta_2$ is less than 45°; and
  (c) an edge sharpness of the dots is such that the ratio of $r_e$:p is less than 5%, where p is the distance from edge to edge across the center of the dot top, and $r_e$ is the radius of curvature of the dot's edge.

In another preferred embodiment, the present invention relates generally to a plurality of relief dots created in a relief image printing element and forming a relief pattern, wherein said plurality of relief dots are created during a digital platemaking process, and
wherein said plurality of relief dots comprise at least one geometric characteristic selected from the group consisting of:
  (a) a top surface of the dot is substantially planar
  (b) a shoulder angle of the relief dots is such that (i) the overall shoulder angle is greater than 50°, or (ii) $\theta_1$ is greater than 70° and $\theta_2$ is less than 45°;
  (c) a depth of relief between the relief dots, measured as a percentage of the overall plate relief, is greater than about 9%; and
  (d) an edge sharpness of the relief dots is such that the ratio of $r_e$:p is less than 5%.

The present invention also relates generally to a method of making a relief image printing element from a photosensitive printing blank, said photosensitive printing blank comprising a laser ablatable mask layer disposed on at least one photocurable layer, the method comprising the steps of:
  (a) selectively laser ablating the laser ablatable mask layer to create an in situ mask and uncovering portions of the photocurable layer;
  (b) exposing the laser ablated printing blank to at least one source of actinic radiation through the in situ mask to selectively cross link and cure portions of the photocurable layer,
wherein the diffusion of oxygen into the at least one photocurable layer is limited by deploying a diffusion barrier on top of the in-situ mask and any uncovered portions of the photocurable layer prior to step (b).

In a preferred embodiment, the diffusion barrier is preferably selected from the group consisting of:
  i) a barrier membrane laminated to the in situ mask and any uncovered portions of the photocurable layer before the exposure step; and
  ii) a layer of liquid coated onto the in situ mask and any uncovered portions of the photocurable layer, preferably an oil, prior to the exposure step;
wherein the barrier membrane and/or the layer of liquid have an oxygen diffusion coefficient of less than $6.9 \times 10^{-9}$ m$^2$/sec, preferably less than $6.9 \times 10^{-10}$ m$^2$/sec and most preferably less than $6.9 \times 10^{-11}$ m$^2$/sec.

In another preferred embodiment, the at least one source of actinic radiation delivers energy in a substantially linear or collimated fashion.

BRIEF DESCRIPTION OF THE DRAWINGS

For a fuller understanding of the invention, reference is had to the following description taken in connection with the accompanying figures, in which.

DETAILED DESCRIPTION OF THE INVENTION

Figure 1:
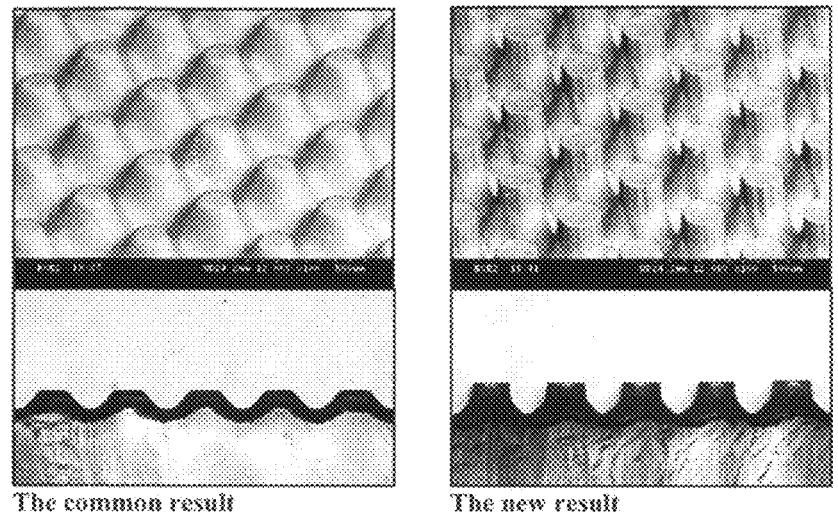
FIG. 1 depicts a printing element with a plurality of dots demonstrating the unique dot/shoulder structure of the invention as compared to the dots of a printing element exposed without the benefit of this invention.

The inventors of the present invention have found that the shape and structure of a printing dot 1 has a profound impact on the way it prints. Knowing this, one can manipulate the resultant shape of the printing dots 1 to optimize printing by utilizing the printing methods described herein. FIG. 1 depicts a printing element with a plurality of dots 1 demonstrating the unique dot/shoulder structure of the invention as compared to the dots of a printing element exposed without the benefit of this invention.

Figure 2:
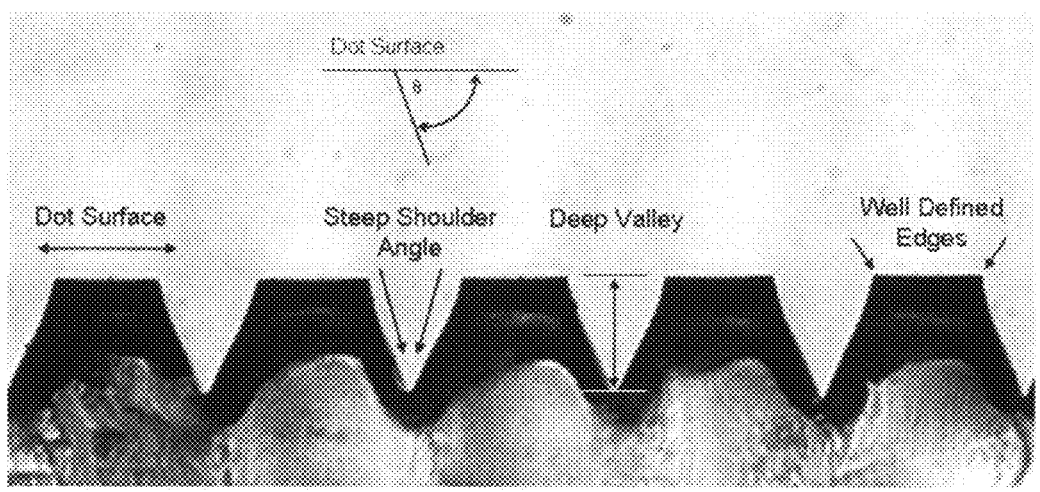
FIG. 2 depicts a schematic representation of four dot shape measurements related to the creation of an optimum dot for flexographic printing.

More particularly, the inventors of the present invention have found that a particular set of geometric characteristics define a flexo dot shape that yields superior printing performance, as shown in FIG. 2. The geometric parameters that characterize the optimum flexographic printing dot 1, especially in digital flexo printing, include:

(1) planarity of the dot top 2;
(2) shoulder angle 4 of the dot;
(3) depth of relief 6 between the dots 1; and
(4) sharpness of the edge 8 at the point where the dot top 2 transitions to the dot shoulder 4.

However the dot shape shown in FIG. 2 is not necessarily the most optimum dot shape, depending on the substrate being printed, among other factors.

Figure 3:
FIG. 3 depicts rounded edges on a 5% flexo dot wherein the entire dot surface is rounded.
Figure 4:
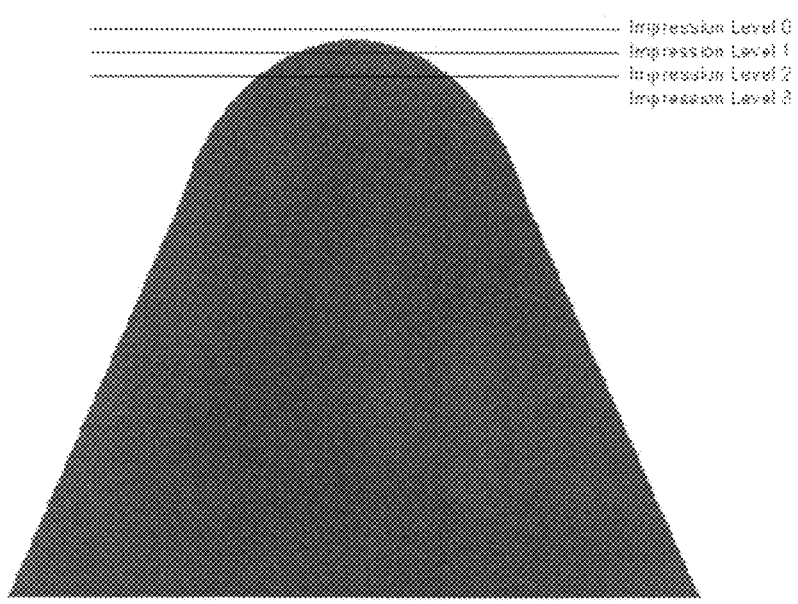
FIG. 4 depicts a diagram of increasing contact patch size with impression on a dot with a non-planar top.
Figure 5:
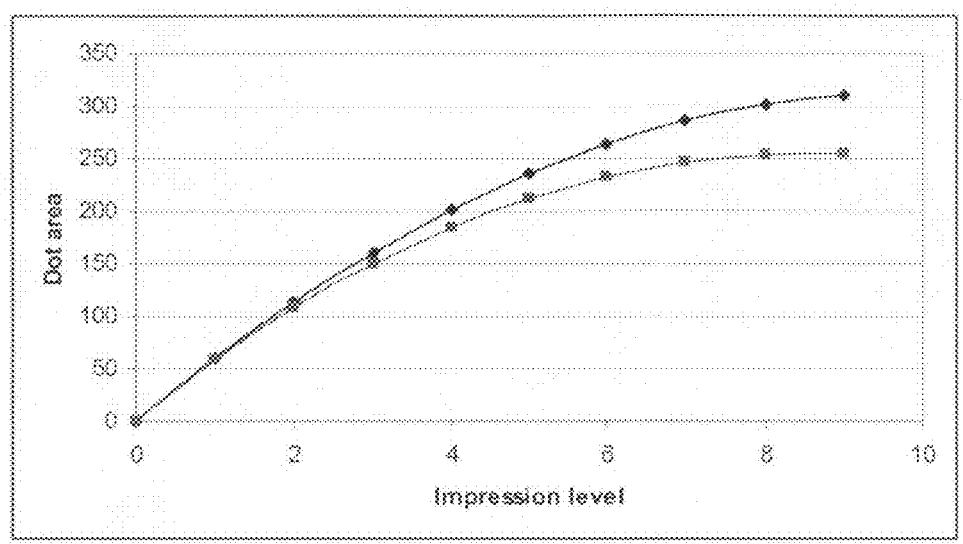
FIG. 5 depicts a mathematical representation of the increase in contact patch size of a non-planar dot with increasing impression. The top line depicts the rate of increase without the effect of bulk compression, while the bottom line includes a correction factor for the bulk compression.

Firstly, the planarity of the dot top 2 was found to be a contributing factor to printing performance. Flexo plates imaged by typical digital imaging processes tend to create dots with rounded tops, as seen, for example, in FIG. 3, in which a 5% dot is shown. This well-known phenomenon is caused by oxygen inhibition of photopolymerization and tends to affect smaller dots more than larger ones as described in more detail above. A planar dot 2 is preferred throughout the tonal range. Most preferred are planar dot top 2, even on dots 1 in the highlight range (i.e., 0-10% tonal). This is illustrated in FIG. 4, which shows a diagram of increasing contact patch size with several impression levels on a printing dot 1 having a non-planar top. Furthermore, FIG. 5 shows a mathematical representation of the increase in contact patch size of non-planar dot with increasing impression. The top line shows the rate of increase without the effect of bulk compression and the bottom line includes a correction factor for bulk compression.

Figure 15:
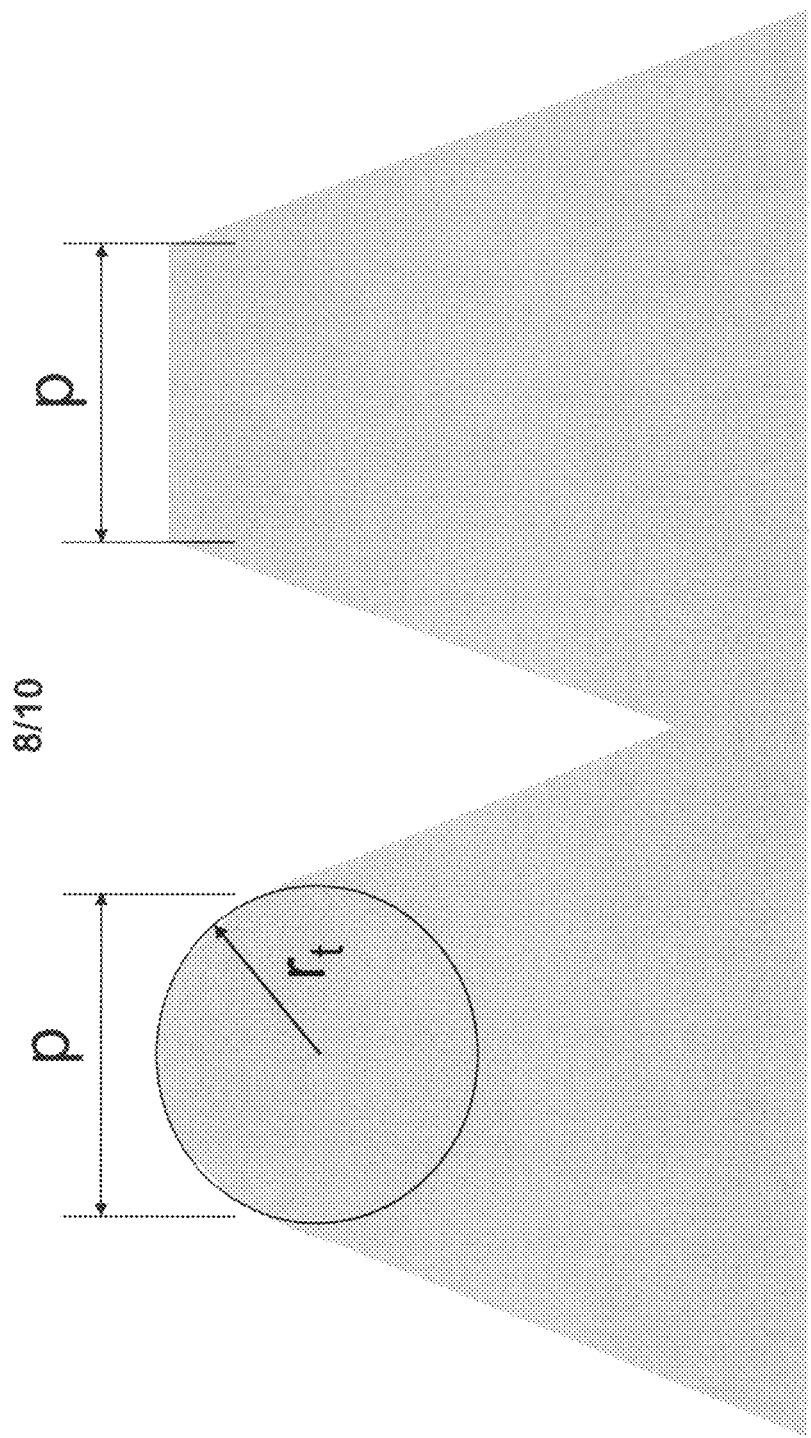
FIG. 15 describes a means of characterizing the planarity of a dot's printing surface where p is the distance across the dot top, and $r_t$ is the radius of curvature across the surface of the dot.

The planarity of the top of a dot can be measured as the radius of curvature across the top surface 2 of the dot 1, $r_t$, as shown in FIG. 15. Preferably, the top of the dot 2 has a planarity where the radius of curvature of the dot top 2 is greater than the thickness of the photopolymer layer, more preferably twice the thickness of the photopolymer layer, and most preferably more than three times the total thickness of the photopolymer layer.

Thus, it can be seen that the rounded dot surface is not ideal from a printing perspective because the size of the contact patch between the print surface and the dot varies exponentially with impression force. In contrast, a planar dot surface should have the same contact patch size within a reasonable range of impression and is thus preferred, especially for dots in the highlight range (0-10% tone).

Figure 6:
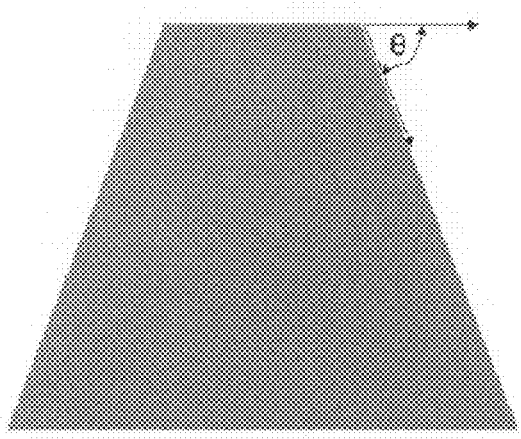
FIG. 6 depicts the measurement of the dot shoulder angle $\theta$.

A second parameter is the angle of the dot shoulder 4, which was found to be a good predictor of print performance. The dot shoulder 4 is defined as shown in FIG. 6 as the angle θ formed by the dot's top 2 and side 4. At the extreme, a vertical column would have a 90° shoulder angle, but in practice most flexo dots 1 have an angle that is considerably lower, often nearer 45° than 90°.

The shoulder angle can vary depending on the size of the dots as well. Small dots, for example in the 1-15% range, may have large shoulder angles, while larger dots, for example greater than about 15% dots may exhibit smaller shoulder angles. It is desirable for all dots to have the largest shoulder angle possible.

Figure 7:
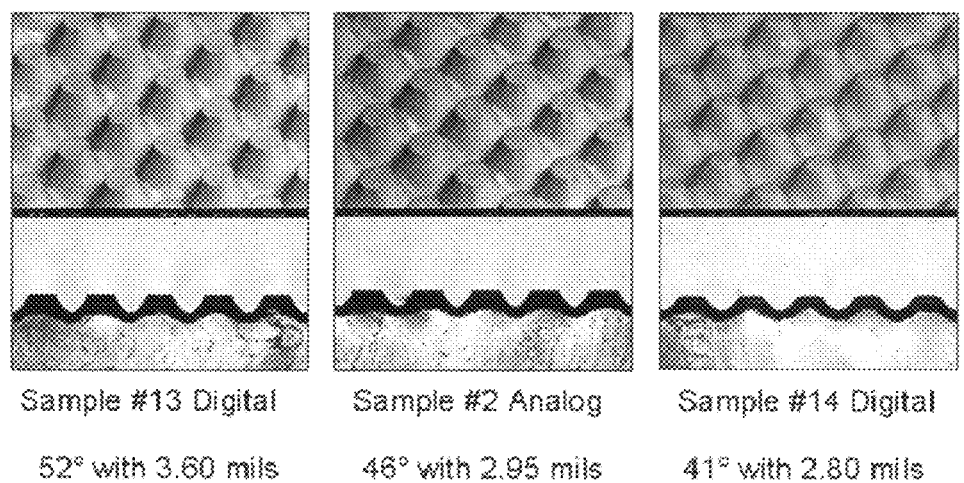
FIG. 7 depicts dot shoulder angles for 20% dots made by different imaging techniques along with their respective dot reliefs.

FIG. 7 depicts dot shoulder angles for 20% dots made by different imaging techniques. In flexo plates made by analog imaging processes, dot shoulder angles are often close to 45° as seen in Sample 2 of FIG. 7. Digital imaging processes for flexo plates increase this angle, especially for smaller dots, into the more preferred range of greater than about 50°, but this angle is not conferred on larger dots as seen in Sample 14 of FIG. 7 and comes with the undesirable side effect of rounded dot tops or edges. In contrast, through the use of the imaging technology process described herein, dot shoulder angles of digital flexo plates can be improved to greater than about 50°, even for large dots such as the 20% dot shown in Sample 13 of FIG. 7 which depicts dots that were produced in accordance with the process described herein.

There are two competing geometric constraints on shoulder angle—dot stability and impression sensitivity. A large shoulder angle minimizes impression sensitivity and gives the widest operating window on press, but at the expense of dot stability and durability. In contrast, a lower shoulder angle improves dot stability but makes the dot more sensitive to impression on press. In practice today, most dots are formed in such a way as to have an angle that represents a compromise between these two needs.

Figure 8:
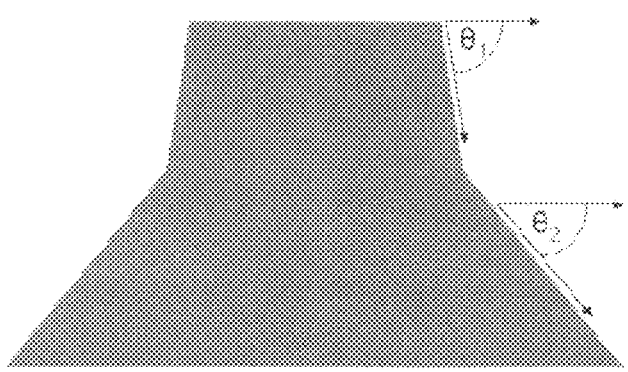
FIG. 8 depicts a dot with two shoulder angles.

An ideal dot would eliminate the need for compromise between these two requirements by separating the sections of the dots which perform the two functions (print impression and dot reinforcement) and giving each dot a shoulder angle that is especially suited for its purpose. Such a dot would have two angles 10 and 12 when viewed from the side as depicted in FIG. 8. The angle 10 closest to the print surface, $\theta_1$, would have a large angle so as to minimize impression sensitivity, while the angle 12 closer to the dot's base, $\theta_2$, would be smaller so as to confer the greatest physical reinforcement of the dot structure and the greatest stability. However, dot shapes of this type are not easily obtained by conventional analog or digital flexographic photopolymers and imaging techniques, because the dot shape is to a large extent determined by the imaging technique used.

Figure 9:
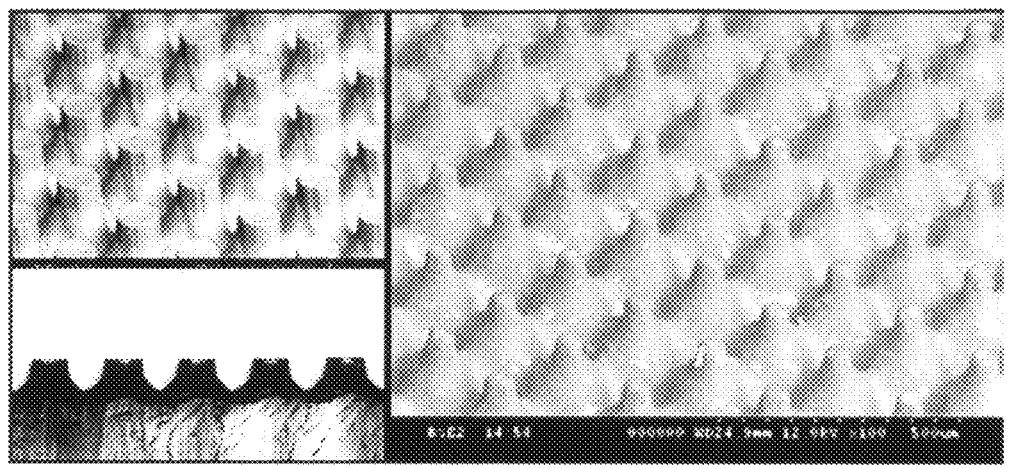
FIG. 9 depicts examples of compound shoulder angle dots created by a method in accordance with the present invention as compared to compound shoulder angle dots created by a direct write imaging process.
Figure 10:
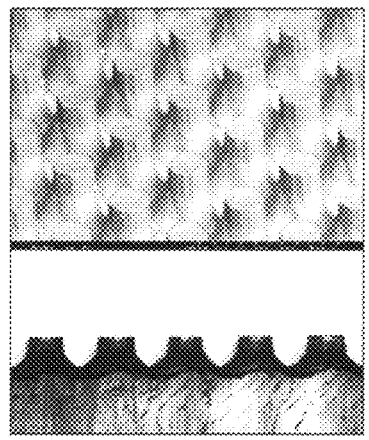
FIG. 10 depicts the shoulder angles and relief depth between compound shoulder angle dots.

Imaging techniques such as the process described herein have been able to create such compound shoulder angle dots as shown in FIG. 9. The two figures on the left of FIG. 9 depict dots produced in the process of the present invention while the figure on the right depicts dots produced in a direct write imaging process. The compound shoulder angle dots of the present invention have very high shoulder angles nearest the dot top (the print surface) but are structurally sound due to the broad base and the much lower shoulder angle near the dot's base, where it attaches to the "floor" of the plate as seen in FIG. 10. This compound shoulder angle dot has been shown not only to print very well at optimum impression levels, but also exhibits extraordinary resistance to print gain at higher impression levels.

A dot shoulder angle of >50° is preferred throughout the tonal range. A dot shoulder angle of >70° or more is preferred. Most preferred is a dot having a "compound angle" shoulder with $\theta_1$ (the angle nearest the dot top) of >70° or more and $\theta_2$ (the angle nearest the dot floor attachment) of 45° or less. As used herein, dot shoulder angle means the angle formed by the intersection of a horizontal line tangential to the top of the dot 2 and a line representing the adjacent dot side wall 4 as shown in FIG. 6. As used herein, $\theta_1$ means the angle formed by the intersection of a horizontal line tangential to the top of the dot and a line representing the portion of the adjacent shoulder wall 10 nearest the top of the dot as shown in FIG. 8. As used herein, $\theta_2$ means the angle formed by a horizontal line and a line representing the sidewall of the dot 12 at a point nearest the base of the dot, as shown in FIG. 8.

Figure 11:
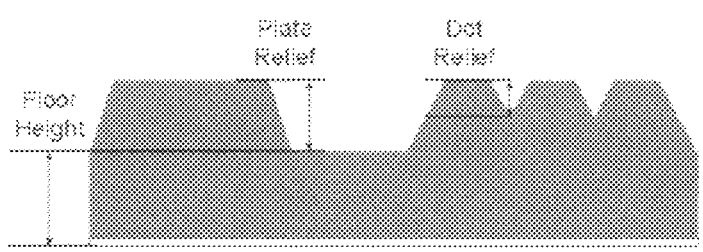
FIG. 11 depicts relief image definitions.

A third parameter is plate relief, which is expressed as the distance between the floor of the plate 20 and the top of a solid relief surface 2 as shown in FIG. 11. For example, a 0.125 inch thick plate is typically made so as to have an 0.040 inch relief. However, the plate relief is typically much larger than the relief between dots 6 in tone patches (i.e., the "dot relief"), which is a result of the close spacing of the dots 1 in tonal areas. The low relief between dots 6 in tonal areas means that the dots 1 are structurally well-supported, but can cause problems during printing as ink builds up on the plate and eventually fills in the areas between dots 6, causing dot bridging or dirty print.

Figure 12:
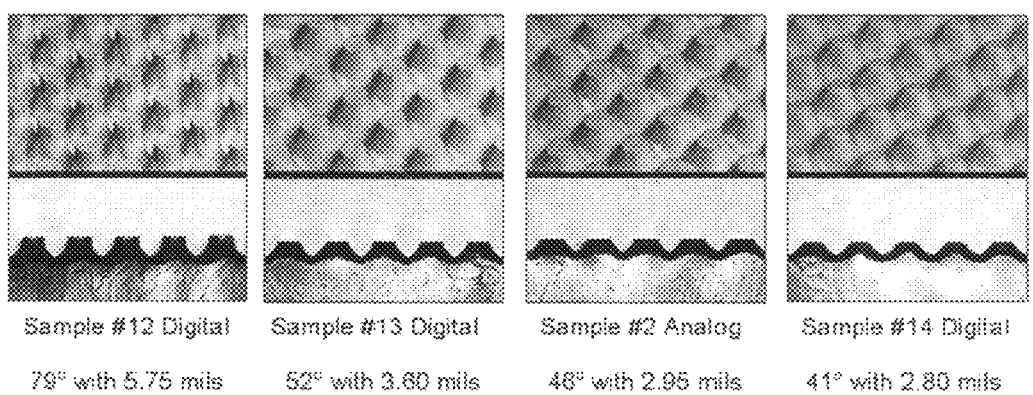
FIG. 12 depicts a range of dot relief levels with their respective dot shoulder angles.

The inventors have found that deeper dot relief 6 can reduce this problem significantly, leading to longer print runs with less operator interference, a capability that is often called "cleaner printing." The dot relief 6 is to a certain extent linked to the dot's shoulder angle, as shown in FIG. 12 which demonstrates dot relief 6 changes with dot shoulder angle. The four samples are taken from plates having a 0.125 inch total thickness and an 0.040 inch thick plate relief. As seen in FIG. 12, dots 1 made by standard analog and digital imaging processes (Samples 2 and 14, respectively) often have dot reliefs 6 that are less than about 10% of the overall plate relief, in contrast, enhanced imaging processes can produce dot reliefs 6 that are greater than about 9% (Sample 13) or more preferably, greater than about 13% of the plate relief (Sample 12).

Figure 13:
FIG. 13 depicts rounded dot edges on a 20% dot made by standard digital imaging of a flexo plate.

A fourth characteristic that distinguishes an optimum dot for flexo printing is the presence of a well-defined boundary between the planar dot top and the shoulder. Due to the effect of oxygen inhibition, dots made using standard digital flexo photopolymer imaging processes tend to exhibit rounded dot edges. For dots above about 20%, the center of the dot remains planar, but the edges show a profoundly rounded profile as seen in FIG. 13, which shows rounded dot edges on a 20% dot made by digital imaging of the flexographic plate.

Figure 14:
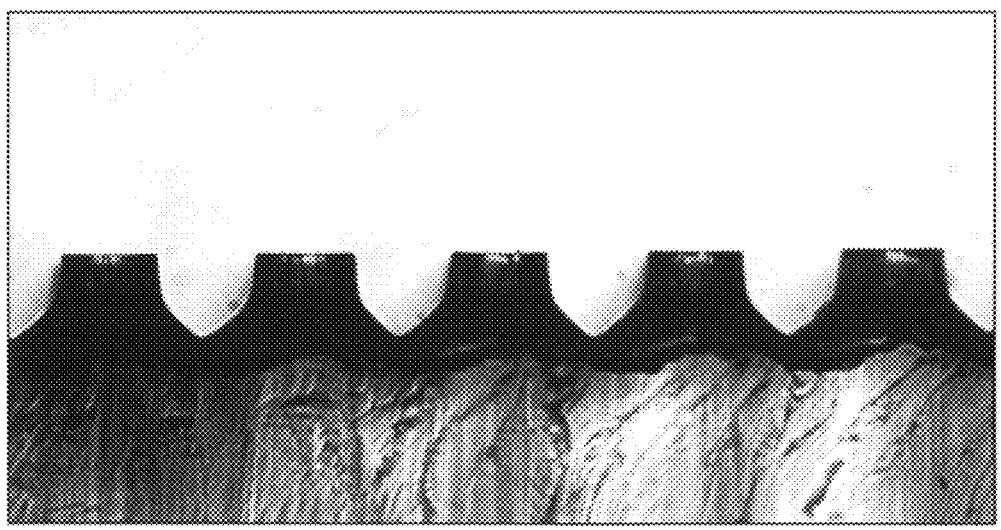
FIG. 14 depicts well-defined dot edges on 20% dots.

It is generally preferred that the dot edges be sharp and defined, as shown in FIG. 14. These well-defined dot edges better separate the "printing" portion from the "support" portion of the dot, allowing for a more consistent contact area between the dot and the substrate during printing.

Figure 16:
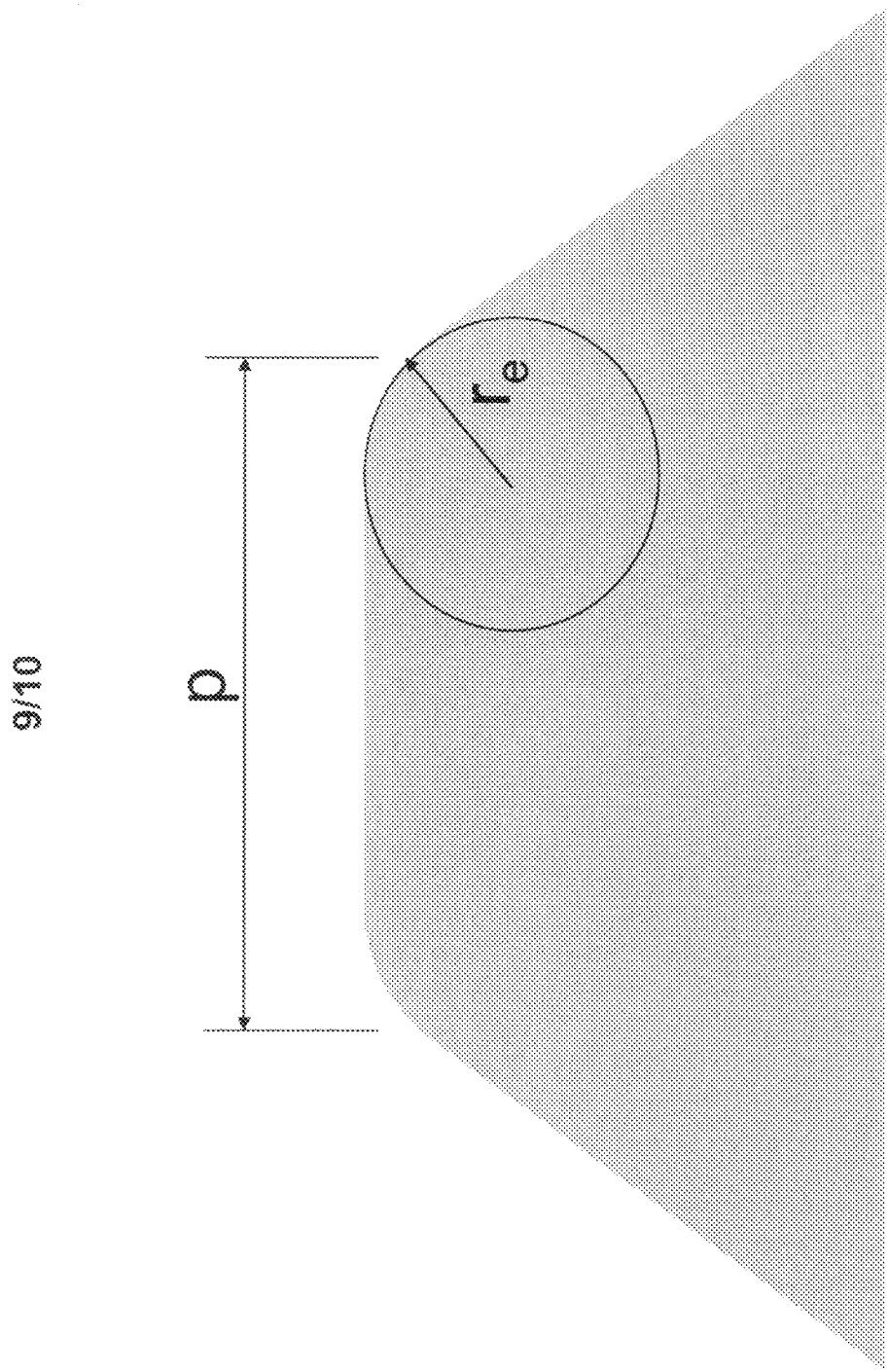
FIG. 16 depicts a flexo dot and its edge, where p is the distance across the dot top. This is used in the characterization of edge sharpness, $r_e$:p, where $r_e$ is the radius of curvature at the intersection of the shoulder and the top of the dot.

Edge sharpness 8 can be defined as the ratio of $r_e$, the radius of curvature (at the intersection of the shoulder 4 and the top of the dot 2) to p, the width of the dot's top 2 or printing surface, as shown in FIG. 16. For a truly round-tipped dot, it is difficult to define the exact printing surface because there is not really an edge in the commonly understood sense, and the ratio of $r_e$:p can approach 50%. In contrast, a sharp-edged dot would have a very small value of $r_e$, and $r_e$:p would approach zero. In practice, an $r_e$:p of less than 5% is preferred, with an $r_e$:p of less than 2% being most preferred. FIG. 16 depicts a flexo dot 1 and its edge 8, where p is the distance across the dot top 2 and demonstrates the characterization of edge sharpness, $r_e$:p, where $r_e$ is the radius of curvature at the intersection of the shoulder and the top of the dot 2.

Figure 17:
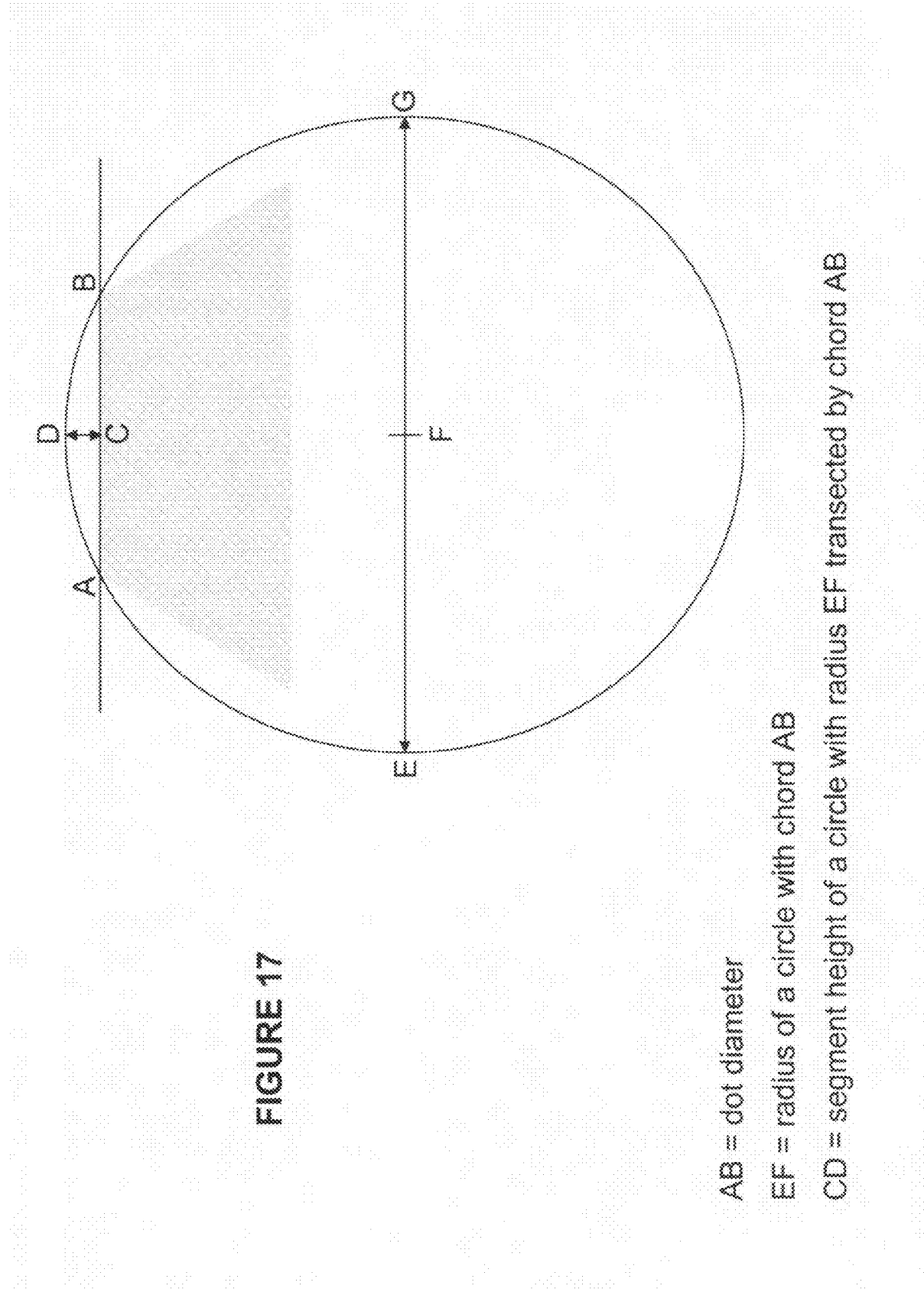
FIG. 17 depicts chord measurement calculations for the top of a flexo dot in accordance with the present invention.

Finally, FIG. 17 depicts yet another means of measuring planarity of a flexo dot. (AB) is the diameter of the top of the dot, (EF) is the radius of a circle with chord (AB) and (CD) is the segment height of a circle with radium EF transected by chord (AB). Table 1 depicts data for various dot % at 150 lines per inch (LPI) and Table 2 depicts data for various dot % at 85 lpi.

TABLE 1

Chord measurement calculations (mils) at 150 lpi

| EF | Dot % | AB | CD | CD/AB |
|---|---|---|---|---|
| 67 | 1 | 0.75 | 0.001049 | 0.1% |
| 67 | 2 | 1 | 0.001866 | 0.2% |
| 67 | 7 | 2 | 0.007463 | 0.4% |
| 67 | 17 | 3 | 0.016793 | 0.6% |
| 67 | 45 | 5 | 0.046658 | 0.9% |
| 67 | 84 | 7 | 0.091488 | 1.3% |
| 67 | 95 | 8 | 0.119510 | 1.5% |

TABLE 2

Chord measurement calculations (mils) at 85 lpi

| EF | Dot % | AB | CD | CD/AB |
|---|---|---|---|---|
| 250 | 1 | 1.33 | 0.000884 | 0.1% |
| 250 | 2 | 1.88 | 0.001767 | 0.1% |
| 250 | 7 | 3.51 | 0.006160 | 0.2% |
| 250 | 15 | 5.14 | 0.013210 | 0.3% |
| 250 | 45 | 8.91 | 0.039700 | 0.4% |
| 250 | 85 | 12.42 | 0.077140 | 0.6% |
| 250 | 95 | 14.09 | 0.099284 | 0.7% |

Furthermore, in order to reduce print fluting when printing on corrugated board substrates and to produce the preferred dot structure described herein, the inventors of the present invention have found that it is necessary to (1) remove air from the exposure step; and preferably (2) alter the type, power and incident angle of illumination.

The use of these methods together yields a dot shape that is highly resistant to print fluting and shows exceptional impression latitude on press (i.e., resistance to print gain changes when more pressure is applied to the plate during printing).

The inventors herein have discovered that a key factor in beneficially changing the shape of printing dots formed on a printing element for optimal relief printing is removing or limiting diffusion of air into the photocurable layer during exposure to actinic radiation. The inventors have found that diffusion of air into the photocurable layer can be limited by: (1) laminating a barrier membrane on top of the flexo plate to cover the in situ mask and any uncovered portions of photocurable layer. The membrane can most beneficially be applied after the laser ablation used to create the in situ mask, but before exposure to actinic radiation. The inventors of the present invention have also found that this sheet can be used to impart a defined texture to the print surface of the plate, which is an additional capability and benefit of this method.

(2) coating the in situ mask and any uncovered photopolymer layer with a liquid layer, preferably an oil;
wherein the barrier membrane and/or liquid layer have a coefficient of oxygen diffusion of less than $6.9 \times 10^{-9}$ m$^2$/sec, preferably less than $6.9 \times 10^{-10}$ m$^2$/sec and most preferably less than $6.9 \times 10^{-11}$ m$^2$/sec.

Altering the type, power and incident angle of illumination can also be useful in this regard and can be accomplished by multiple methods. For example, altering the type, power and incident angle of illumination can be accomplished by using a collimating grid above the plate during the exposure step. The use of a collimating grid for analog plates is described with respect to analog printing plates in U.S. Pat. No. 6,245,487 to Randall, the subject matter of which is herein incorporated by reference in its entirety. In the alternative, the use of a point light, or other semi-coherent light source can be used. These light sources are capable of altering the spectrum, energy concentration, and incident angle to varying degrees, depending on the light source and exposure unit design. Examples of these point light sources include Olec Corporation's OVAC exposure unit and Cortron Corporation's eXact exposure unit. Finally, a fully coherent (e.g., laser) light source can be used for exposure. Examples of the laser light sources include U.V. laser diodes used in devices such as the Luescher Xpose imager and the Heidelberg Prosetter imager. Other light sources that can alter the type, power and incident angle of illumination can also be used in the practice of the invention.

In another embodiment, the present invention relates generally to a method of making a relief image printing element from a photosensitive printing blank, said photosensitive printing blank comprising a laser ablatable mask layer disposed on at least one photocurable layer, the method comprising the steps of:
a) selectively laser ablating the laser ablatable mask layer to create an in situ mask and uncovering portions of the photocurable layer;
b) exposing the laser ablated printing blank to at least one source of actinic radiation through the in situ mask to selectively cross link and cure portions of the photocurable layer,
wherein the diffusion of air into the at least one photocurable layer is limited during the exposing step by a method selected from at least one of:
i) laminating a barrier membrane to the in situ mask and any uncovered portions of the photocurable layer before the exposure step; and
ii) coating the in situ mask and any uncovered portions of the photocurable layer with a layer of liquid, preferably an oil, prior to the exposure step.

A wide range of materials can serve as the barrier membrane layer. Three qualities that the inventors have identified in producing effective barrier layers include optical transparency, low thickness and oxygen transport inhibition. Oxygen transport inhibition is measure in terms of a low oxygen diffusion coefficient. As noted, the oxygen diffusion coefficient of the membrane (or the liquid layer) should be less than $6.9 \times 10^{-9}$ m$^2$/sec., preferably less than $6.9 \times 10^{-10}$ m$^2$/sec. and most preferably less than $6.9 \times 10^{-11}$ m$^2$/sec.

Examples of materials which are suitable for use as the barrier membrane layer of the present invention include those materials that are conventionally used as a release layer in flexographic printing elements, such as polyamides, polyvinyl alcohol, hydroxyalkyl cellulose, polyvinyl pyrrolidinone, copolymers of ethylene and vinyl acetate, amphoteric interpolymers, cellulose acetate butyrate, alkyl cellulose, butryal, cyclic rubbers, and combinations of one or more of the foregoing. In addition, films such as polypropylene, polyethylene, polyvinyl chloride, polyester and similar clear films can also serve well as barrier films. In one preferred embodiment, the barrier membrane layer comprises a polypropylene film or a polyethylene terephthalate film. One particularly preferred barrier membrane is a Fuji® Final Proof receiver sheet membrane available from Fuji Films.

The barrier membrane should be as thin as possible, consistent with the structural needs for handling of the film and the film/photopolymer plate combination. Barrier membrane thicknesses between about 1 and 100 microns are preferred, with thickness of between about 1 and about 20 microns being most preferred.

The barrier membrane needs to have a sufficient optical transparency so that the membrane will not detrimentally absorb or deflect the actinic radiation used to expose the photosensitive printing blank. As such it is preferable that the barrier membrane have an optical transparency of at least 50%, most preferably at least 75%.

The barrier membrane needs to be sufficiently impermeable to oxygen diffusion so that it can effectively limit diffusion of oxygen into the photocurable layer during exposure to actinic radiation. The inventors herein have determined that the barrier membrane materials noted above in the thicknesses noted above will substantially limit the diffusion of oxygen into the photocurable layer when used as described herein.

In addition to limiting the diffusion of oxygen into the photocurable layer, the barrier membrane can be used to impart or impress a desired texture to the printing surfaces of the printing element or to control the surface roughness of the printing surfaces of the printing element to a desired level. In one embodiment of the present invention, the barrier membrane comprises a matte finish and the texture of the matte finish may be transferred to the plate surface to provide a desired surface roughness on the surface of the printing plate. For example, in one embodiment, the matte finish provides an average surface roughness that is between about 700 and about 800 nm. In this instance the barrier membrane comprises a polypropylene film with a cured photopolymer layer thereon and the cured photopolymer layer has a defined topographic pattern defined thereon. The texture or roughness of the barrier membrane surface will be impressed into the surface of the photopolymer (photocurable) layer during the lamination step. In general, surface roughness in this regard can be measured using a Veeco Optical Profilometer, model Wyko NT 3300 (Veeco Instruments, Plainville, N.Y.).

In another embodiment of the present invention, the barrier membrane comprises a smooth nanotechnology film with a roughness of less than 100 nm. In this embodiment, the average surface roughness of the printing plate can be controlled to less than about 100 nm.

The barrier layer may be laminated to the surface of the printing plate using pressure and/or heat in a typical lamination process.

In another embodiment, the printing plate may be covered with a layer of liquid, preferably a layer of oil, prior to the exposure step, and the oil may be either clear or tinted. The liquid or oil here serves as another form of a barrier membrane. As with the solid barrier membrane, it is important that the liquid used be optically transparent to the actinic radiation used to expose the photocurable layer. The optical transparency of the liquid layer is preferably at least 50%, most preferably at least 75%. The liquid layer must also be capable of substantially inhibiting the diffusion of oxygen into the photocurable layer with an oxygen coefficient of diffusion as noted above. The liquid must also be viscous enough to remain in place during processing. The inventors herein have determined that a liquid layer from 1 μm to 100 μm in thickness comprising any of the following oils, by way of example and not limitation, will meet the foregoing criteria: paraffinic or naphthenic hydro-carbon oils, silicone oils and vegetable based oils. The liquid should be spread upon the surface of the printing element after the in situ mask is created but before the printing blank is exposed to actinic radiation.

After the photosensitive printing blank is exposed to actinic radiation as described herein, the printing blank is developed to reveal the relief image therein. Development may be accomplished by various methods, including water development, solvent development and thermal development, by way of example and not limitation.

Finally, the relief image printing element is mounted on a printing cylinder of a printing press and printing is commenced.

Thus, it can be seen that the method of making the relief image printing element described herein produces a relief image printing element having a relief pattern comprising relief dots to be printed that are configured for optimal print performance. In addition, through the platemaking process described herein, it is possible to manipulate and, optimize certain geometric characteristics of the relief dots in the resulting relief image.

What is claimed is:

1. A flexographic relief image printing element comprising at least one photopolymer layer on a backing layer, wherein the at least one photopolymer layer comprises a cured floor layer therein and wherein the cured floor layer establishes an overall depth of plate relief;
    wherein a plurality of dots in relief are created in the at least one photopolymer layer by selectively exposing the at least one photopolymer layer to actinic radiation to selectively crosslink portions of the at least one photopolymer layer and separating and removing the uncrosslinked portions of the at least one photopolymer layer, and
    wherein said plurality of dots comprise at least one characteristic selected from the group consisting of:
    a) a planarity of a top surface of the dot is such that the radius of curvature of the top surface of the dot, $r_t$, is greater than the total thickness of the at least one photopolymer layer;
    b) a shoulder angle of the dot is such that the overall shoulder angle of the dot is greater than 50°; and
    c) an edge sharpness of the dots is such that the ratio of the radius of curvature at the intersection of the shoulder and the top surface of the dot, $r_e$, to the width of the top of the dot, p, is less than 5%; and
    wherein a dot relief of the flexographic relief image printing element is greater than about 9% of the overall plate relief.

2. The flexographic relief image printing element according to claim 1, wherein shoulder angle of the dot is such that the overall shoulder angle is greater than about 50°.

3. The flexographic relief image printing element according to claim 2, wherein the shoulder angle of the dot is such that overall shoulder angle is greater than about 70°.

4. The flexographic relief image printing element according to claim 1, wherein the ratio of $r_e$:p is less than 2%.

5. The flexographic relief image printing element according to claim 1, wherein the dot relief of the printing element is greater than about 12% of the overall plate relief.

6. A plurality of relief dots created in a relief image printing element, wherein the relief image printing element comprises, in order, a laser ablatable mask layer, at least one photopolymer layer, and a backing layer, wherein a plurality of dots in relief are created in the at least one photopolymer layer during a digital platemaking process, wherein the at least one photopolymer layer comprises a cured floor layer therein and the cured floor layer establishes the overall depth of plate relief;
    the digital platemaking process including the steps of (i) laser ablating a laser ablatable mask layer to create an in situ negative; (ii) selectively exposing the at least one photopolymer layer to actinic radiation through the in situ negative to selectively crosslink portions of the at least one photopolymer layer and (iii) separating and removing uncrosslinked portions of the at least one photopolymer layer, and
    wherein said plurality of relief dots comprise at least one geometric characteristic selected from the group consisting of:
        (a) a planarity of a top surface of the relief dots, measured as the radius of curvature of the top surface of the dot, $r_t$, is greater than the total thickness of the photopolymer layer;
        (b) a shoulder angle of the relief dots is such that (i) the overall shoulder angle is greater than 50°; and
        (c) an edge sharpness of the dots is such that the ratio of the radius of curvature at the intersection of the shoulder and the top surface of the dot, $r_e$, to the width of the top of the dot, p, is less than 5%; and
    wherein a depth of relief between the relief dots, measured as a percentage of the overall plate relief, is greater than about 9%.

7. The plurality of relief dots according to claim 6, wherein said planarity of the top surface of the relief dots is such that the radius of curvature of the top surface of the dot, $r_t$, is greater than the total thickness of the photopolymer layer.

8. The plurality of relief dots according to claim 6, wherein said shoulder angle of the relief dots is such that the overall shoulder angle is greater than 50°.

9. The plurality of relief dots according to claim 8, wherein the shoulder angle of the relief dots is such that the overall shoulder angle is greater than about 70°.

10. The plurality of relief dots according to claim 6, wherein the depth of relief between the relief dots is greater than about 12% of the overall plate relief.

11. The plurality of relief dots according to claim 6 wherein the edge sharpness of the relief dots is such that the ratio of $r_e$:p is less than about 2 percent.

12. The plurality of relief dots according to claim 6, wherein said plurality of relief dots comprise the following geometric characteristics:
    a) a planar top surface, such that the radius of curvature of the top surface to the dot, $r_t$, is greater than the total thickness of the photopolymer layer;
    b) an overall shoulder angle of the relief dots is greater than 50°;
    c) a depth of relief between dots, measured as a percentage of the overall plate relief, is greater than about 9%; and
    d) a ratio of $r_e$:p is less than about 5%.

13. The flexographic relief image printing element according to claim 1, wherein the top surface of each of the plurality of relief dots comprises a defined topographic pattern.

14. The flexographic relief image printing element according to claim 1, wherein an average surface roughness of the relief image printing element is less than about 100 nm.

15. The flexographic relief image printing element according to claim 13, wherein an average surface roughness of the relief image printing element is between about 700 and about 800 nm.

16. A plurality of relief dots created in a relief image printing element, wherein the relief image printing element comprises, in order, a laser ablatable mask layer, at least one photopolymer layer and a backing layer, and wherein the at least one photopolymer layer comprises a cured floor layer therein and the cured floor layer establishes the overall depth of plate relief; and wherein the relief image printing element is created by (i) laser ablating the laser ablatable mask layer to create an in situ negative; (ii) laminating an oxygen barrier membrane to a top of the laser ablatable mask layer; (iii) selectively exposing the at least one photopolymer layer to actinic radiation through the in situ negative and the oxygen barrier membrane to selectively crosslink portions of the at least one photopolymer layer; and (iv) developing the relief image printing element to separate and remove uncrosslinked portions of the at least one photopolymer layer, and wherein said plurality of relief dots comprise at least one geometric characteristic selected from the group consisting of:
 (a) a planarity of a top surface of the relief dots, measured as the radius of curvature of the top surface of the dot, $r_f$, is greater than the total thickness of the photopolymer layer;
 (b) a shoulder angle of the relief dots is such that the overall shoulder angle is greater than 50°; and
 (c) an edge sharpness of the dots is such that the ratio of the radius of curvature at the intersection of the shoulder and the top surface of the dot, $r_e$, to the width of the top of the dot, p, is less than 5%; and wherein a depth of relief between the relief dots, measured as a percentage of the overall plate relief, is greater than about 9%.

\* \* \* \* \*